United States Patent [19]

Anthony et al.

[11] Patent Number: 5,437,891
[45] Date of Patent: Aug. 1, 1995

[54] CHEMICAL VAPOR DEPOSITION OF POLYCRYSTALLINE DIAMOND WITH <100> ORIENTATION AND <100> GROWTH FACETS

[75] Inventors: Thomas R. Anthony, Niskayuna; James F. Fleischer, Scotia, both of N.Y.; David E. Slutz, Columbus, Ohio

[73] Assignee: General Electric Company, Schenectady, N.Y.

[21] Appl. No.: 264,268

[22] Filed: Jun. 23, 1994

[51] Int. Cl.$^6$ ............................................. C23C 16/26
[52] U.S. Cl. ................... 427/249; 427/122; 427/255.1; 427/314; 423/446; 428/408; 117/929
[58] Field of Search .............. 427/577, 249, 255.1, 427/122, 248.1, 314; 423/446; 156/DIG. 68; 428/408

[56] References Cited

U.S. PATENT DOCUMENTS

| | | | |
|---|---|---|---|
| 4,816,286 | 3/1989 | Hirose | 427/255.1 |
| 5,147,687 | 9/1992 | Garg et al. | 427/249 |
| 5,201,986 | 4/1993 | Ota et al. | 156/610 |

FOREIGN PATENT DOCUMENTS 0376694  7/1990  European Pat. Off. .

OTHER PUBLICATIONS

Beckmann et al., Diamond and Related Materials, 1, pp. 164–167 (1992).

Chu et al, "Mechanism of diamond growth by chemical vapor deposition on diamond (100), (111), and (110) surfaces: Carbon—13 Studies", J. Appl. Phys. 70(3), Aug. 1991, pp. 1695–1705.

Primary Examiner—Roy V. King
Attorney, Agent, or Firm—William H. Pittman

[57] ABSTRACT

Chemical vapor deposition of diamond with <100> orientation and (100) growth facets is performed at an increased growth rate and affords cubic diamond crystals when a gas mixture comprising hydrogen, a hydrocarbon such as methane and specific minor amounts of oxygen and an inert gas, preferably predominantly nitrogen, is employed.

7 Claims, No Drawings

CHEMICAL VAPOR DEPOSITION OF POLYCRYSTALLINE DIAMOND WITH <100> ORIENTATION AND <100> GROWTH FACETS

BACKGROUND OF THE INVENTION

This invention relates to the chemical vapor deposition of diamond, and more particularly to the use of an improved gaseous mixture therein to increase growth rate and modify crystal habit and growth orientation.

The fabrication of diamond by chemical vapor deposition (hereinafter sometimes "CVD") is well known it typically involves activation of a mixture of hydrogen and hydrocarbon gases at low pressure in proximity to a substrate, resulting in the creation of elemental carbon species which deposit on the substrate as diamond. Thermal activation may be by radiation (e.g., microwaves), by means of a heated filament or both.

The use of gas mixtures containing other gases is also known. For example, Beckmann et al. in Diamond and Related Materials, 1, 164–167 (1992), describe the addition of oxygen in amounts apparently in the oxygen/carbon mole ratio range of 0.7–1.25, although the precise values are uncertain since the ratio is sometimes identified as O/C and sometimes as C/O. Maximum diamond growth rate appears to be attained at an oxygen/carbon mole ratio of 0.66.

European patent application 376,694 describes a CVD method for deposition of diamond which employs a mixture of (A) hydrogen, (B) an inert gas, (C) a carbon atom-containing gas, typically an aliphatic hydrocarbon, and (D) an oxygen atom-containing inorganic gas, typically oxygen. The gas proportions in the mixture are defined essentially in terms of mole percentages of inert gas and hydrocarbon and mole ratio of oxygen to hydrocarbon, the ranges of all of said proportions being very broad. The advantages of the disclosed method are alleged to be high transparency of the diamond produced, a low defect rate, high strength and increased growth speed.

It has been found, however, that serious problems are encountered at certain ratios within the ranges designated in the European patent application. Oxygen proportions above certain threshold values, for example, cause partial oxidation of the carbon deposited on the substrate. High nitrogen proportions decrease the hardness of the product, suggesting some unknown variety of defect formation.

Diamond produced by the CVD method normally has a <110> growth orientation with (111) growth facets. This crystal structure is in part a result of to the optimum substrate temperature in the range of 600°–850° C. which also has the effect of reducing internal stresses and cracking. At higher temperatures, especially above 930° C., the diamond is deposited in the form of cubic crystals with a <100> growth orientation and (100) facets, but it has poor thermal conductivity and a high degree of internal stress.

It would be very advantageous, if the aforementioned problems could be solved, to grow diamond in the <100> direction and with (100) facets, since stacking faults with such cubic crystals are minimized and the grains are substantially defect-free. It would also be of interest to increase the growth rate of high quality CVD diamond.

SUMMARY OF THE INVENTION

The present invention provides a means for attaining the above-described goals. In particular, CVD diamond with a substantially cubic crystal orientation is grown under relatively mild conditions, particularly as regards temperature of deposition. Moreover, the growth rate of said diamond is substantially increased.

Accordingly, the invention is a method for depositing diamond on a substrate by chemical vapor deposition which comprises activating a gas mixture and contacting said substrate therewith at a pressure below 760 torr, said gas mixture comprising by weight about 90–99% hydrogen, about 0.5–2.0% of a gaseous hydrocarbon, about 0.05–2.0% oxygen and about 0.2–0.5% of at least one inert gas, at least about 95% of said inert gas being nitrogen.

DETAILED DESCRIPTION; PREFERRED EMBODIMENTS

The CVD method for diamond production is known in the art and disclosed in many patents and publications, and therefore it need not be dealt with in detail here. In brief, it involves the passage of a gas mixture into a chamber containing one or more substrates to receive the diamond coating. The conditions employed as such as to activate the gas mixture by converting molecular hydrogen to atomic hydrogen, and this may be achieved by such means as high frequency and thermal excitation.

It is often convenient to employ one or more heated filaments in the deposition chamber at filament temperatures on the order of 2000° C. or above, thus causing the formation of atomic hydrogen and deposition of the desired diamond layer, with placement of the substrate at a distance to produce a substrate temperature in the range of about 600°–850° C. A typical distance for this purpose is on the order of 10 ram. The material of which the filaments are comprised is not critical, any material known in the art as suitable for this purpose being acceptable. Illustrative materials are metallic tungsten, tantalum, molybdenum and rhenium; because of its relatively low cost and particular suitability, tungsten is often preferred.

Normally, the deposition chamber is maintained at reduced pressure, for example about 10 torr. The effluent gases are withdrawn by means of a vacuum pump or its equivalent. The orientation of the substrate and filament(s) in the chamber is not critical to the invention and may be horizontal or vertical. The filament may be in any shape such as straight, curved or spiral. Likewise, the shape, orientation and location in the deposition chamber of the substrate(s) is not critical.

Any substrate material suitable for diamond deposition thereon may be employed. Examples of such materials are niobium, boron, boron nitride, platinum, graphite, molybdenum, copper, aluminum nitride, silver, iron, nickel, silicon, alumina and silica, as well as combinations thereof.

The essential feature of the present invention is the composition of the gas mixture which is the source of the deposited diamond. It comprises hydrogen, a gaseous hydrocarbon, oxygen and at least one inert gas.

Hydrogen is present in the amount of about 90–99%, preferably about 98–99% (all percentages being by weight), and hydrocarbon, preferably methane, in the amount of about 0.5–2.0%, preferably about 0.5–1.5%. Oxygen is present in the amount of about 0.05–2.0%, preferably about 0.05–1.5%, and the inert gas in the amount of about 0.2–0.5%, preferably about 0.3–0.5%.

By "inert gas" is meant nitrogen and the rare gases, the latter particularly including helium, neon and argon. Of the rare gases, argon is preferred by reason of its relative availability. At least about 95%, preferably at least about 97%, of the inert gas is nitrogen. The use of nitrogen as the only inert gas is contemplated, as is the use of mixtures of nitrogen with minor proportions of rare gases. A preferred source of the oxygen and inert gas is air, which comprises about 78% nitrogen, 21% oxygen and 1% argon.

Diamond growth from a simple mixture of hydrogen and hydrocarbon gas under the conditions employed by applicants affords diamond crystals with a <110> orientation and (111) growth facets, typically growing at a rate less than 0.5 micron per hour. No change in crystal habit or growth rate is observed upon the addition of nitrogen or oxygen alone, in the relatively small amounts employed according to the present invention. As previously mentioned, disadvantages are experienced when nitrogen, oxygen or both are present in larger amounts.

However, the employment of both inert gas and oxygen in the proportions prescribed herein results in the formation of cubic diamond crystals, having a <100> orientation and (100) growth facets. In addition, a substantial increase in growth rate, typically of 40% or more, is experienced.

The invention is illustrated by an example in which a vessel, containing a vertical tungsten filament 25 cm. long and 0.36 mm. in diameter and a niobium-coated molybdenum plate parallel to and facing said filament at a distance of 10 mm., was evacuated to a pressure of 10 torr. The filament was heated to a temperature in the range of 2000–2100° C. and a mixture of 98.5% hydrogen, 1.0% methane and 0.5% dry air (i.e., 98.5% hydrogen, 1.0% methane, 0.39% nitrogen, 0.105% oxygen and 0.01% argon) was passed into the vessel at 400 cc. per minute. Rapid growth of diamond on the substrate was observed. After 17 days, the system was shut down and the rate of diamond deposition was calculated as 0.71 micron per hour. The polycrystalline diamond coating on the substrate had a cubic crystal habit, with <100> orientation and (100) growth facets.

What is claimed is:

1. A method for depositing diamond on a substrate by chemical vapor deposition which comprises activating a gas mixture and contacting said substrate therewith at a pressure below 760 torr, said gas mixture comprising by weight about 45.5–99% hydrogen, about 0.5–2.0% of a gaseous hydrocarbon, about 0.05–2.0% oxygen and about 0.2–0.5% of at least one inert gas, at least about 95% of said inert gas being nitrogen; thereby producing polycrystalline diamond with <100> orientation and (100) growth facets.

2. A method according to claim 1 wherein the activation is effected by one or more heated filaments.

3. A method according to claim 1 wherein the substrate temperature is in the range of about 600°–850° C.

4. A method according to claim 3 wherein the gas mixture comprises by weight about 98–99% hydrogen, about 0.5–1.5% hydrocarbon, about 0.05–1.5% oxygen and about 0.3–0.5% inert gas.

5. A method according to claim 3 wherein the inert gas consists of nitrogen.

6. A method according to claim 3 wherein the inert gas consists of a mixture of nitrogen and argon and comprises by weight at least about 97% nitrogen.

7. A method according to claim 3 wherein the oxygen and inert gas are provided in the form of air.

* * * * *